United States Patent
Miura (10) Patent No.: US 10,595,429 B2
(45) Date of Patent: Mar. 17, 2020

(54) ELECTRONIC DEVICE

(71) Applicant: FANUC CORPORATION, Yamanashi (JP)

(72) Inventor: Daisuke Miura, Yamanashi-ken (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 16/375,156

(22) Filed: Apr. 4, 2019

(65) Prior Publication Data

US 2019/0313544 A1    Oct. 10, 2019

(30) Foreign Application Priority Data

Apr. 10, 2018  (JP) ................................. 2018-075122

(51) Int. Cl.
  *H05K 5/00*  (2006.01)
  *H05K 7/14*  (2006.01)
(52) U.S. Cl.
  CPC ......... *H05K 7/1418* (2013.01); *H05K 7/1427* (2013.01)
(58) Field of Classification Search
  USPC ....................................................... 361/756
  See application file for complete search history.

(56) References Cited

U.S. PATENT DOCUMENTS

| | | | | |
|---|---|---|---|---|
| 3,631,325 A | * | 12/1971 | Wenz | H05K 1/0203 361/705 |
| 5,055,061 A | * | 10/1991 | Lichtenwalter | H01R 12/7005 211/41.17 |
| 5,711,677 A | * | 1/1998 | Mui | H05K 7/1417 439/64 |
| 6,735,093 B2 | * | 5/2004 | Mu-Tsai | G06F 1/182 174/377 |
| 7,663,888 B2 | * | 2/2010 | Creasy | H05K 7/1418 361/737 |
| 2019/0200473 A1 | * | 6/2019 | Miura | H05K 7/1405 |
| 2019/0200474 A1 | * | 6/2019 | Miura | H05K 7/1405 |

FOREIGN PATENT DOCUMENTS

| | | |
|---|---|---|
| JP | H05335762 A | 12/1993 |
| JP | H0637473 A | 2/1994 |
| JP | H10126073 A | 5/1998 |
| JP | 2002-246772 A | 8/2002 |

* cited by examiner

*Primary Examiner* — Hung S. Bui
(74) *Attorney, Agent, or Firm* — Robert P. Michal, Esq.; Carter, DeLuca & Farrell LLP (57) ABSTRACT

An electronic device includes pairs of guide rails and elastic members. The pairs of guide rails are provided in a slot correspondingly to both ends of the circuit board in a direction intersecting the insertion direction, the guide rails of each pair extending along the insertion direction respectively on sides of both surfaces of the circuit board inserted in the slot, the pair of guide rails being configured to guide insertion of the circuit board into the slot. When the circuit board is inserted in the slot, each elastic member presses the circuit board against one or the other of the guide rails of the pair.

3 Claims, 9 Drawing Sheets

ELECTRONIC DEVICE

CROSS-REFERENCE TO RELATED APPLICATION

This application is based upon and claims the benefit of priority from Japanese Patent Application No. 2018-075122 filed on Apr. 10, 2018, the contents of which are incorporated herein by reference.

BACKGROUND OF THE INVENTION

Field of the Invention

The present invention relates to an electronic device in which a circuit board is inserted into a slot of a casing so as to fit together a first connector on a side of the circuit board and a second connector in the casing.

Description of the Related Art

Electronic devices of this type include the electronic device disclosed in Japanese Laid-Open Patent Publication No. 2002-246772, for example. The electronic device of Japanese Laid-Open Patent Publication No. 2002-246772 has a casing in which a slot is provided and a circuit board that is inserted in the slot.

This electronic device includes a first connector provided at an end of the circuit board in the direction in which the circuit board is inserted, and a second connector that is provided in the casing and that is fitted with the first connector when the circuit board is inserted in the slot of the casing. The casing is provided with a pair of guide rails extending in the insertion direction in the casing, for guiding the circuit board inserted into the slot.

SUMMARY OF THE INVENTION

In Japanese Laid-Open Patent Publication No. 2002-246772, the circuit board is fixed in the slot by fitting the first connector and the second connector together. Accordingly, when the casing or the circuit board vibrates, the fitted portion (the portion of contact) between the first connector and the second connector and the soldered portion between the first connector and the circuit board is subjected to loads.

Then, if the circuit board is fixed in the slot by means of a member other than a casing, the number of parts of the electronic device and the number of assembly processing steps are increased, resulting in increased costs of the electronic device. On the other hand, when the circuit board is fixed by the casing, e.g., by holding and sandwiching the circuit board with guide rails, the circuit board rubs against the casing at their contact portion, and then the circuit board will be scratched.

Accordingly, an object of the present invention is to provide an electronic device in which a circuit board inserted in a slot of a casing is stably fixed so as to ensure vibration resistance.

According to an aspect of the present invention, an electronic device includes: a casing having a slot; a circuit board configured to be inserted in the slot; a first connector provided at an end of the circuit board in an insertion direction; a second connector provided in the casing and configured to be fitted with the first connector when the circuit board is inserted in the slot; pairs of guide rails provided in the slot correspondingly to respective both ends of the circuit board in a direction intersecting the insertion direction, the guide rails of each of the pairs extending along the insertion direction respectively on sides of both surfaces of the circuit board inserted in the slot, the pairs of guide rails being configured to guide insertion of the circuit board into the slot; and elastic members configured to press the circuit board against one or the other of the guide rails of each of the pairs when the circuit board is inserted in the slot.

According to the present invention, the pressing force of the elastic members presses the circuit board against one of the paired guide rails. As a result, it is possible to stably fix the circuit board inserted in the slot of the casing and ensure vibration resistance.

The above and other objects, features, and advantages of the present invention will become more apparent from the following description when taken in conjunction with the accompanying drawings, in which a preferred embodiment of the present invention is shown by way of illustrative example.

DESCRIPTION OF THE PREFERRED EMBODIMENTS

The electronic device according to the present invention will be described in detail below with reference to the accompanying drawings in conjunction with preferred embodiments.

[Schematic Configuration of Embodiment]

Figure 1:
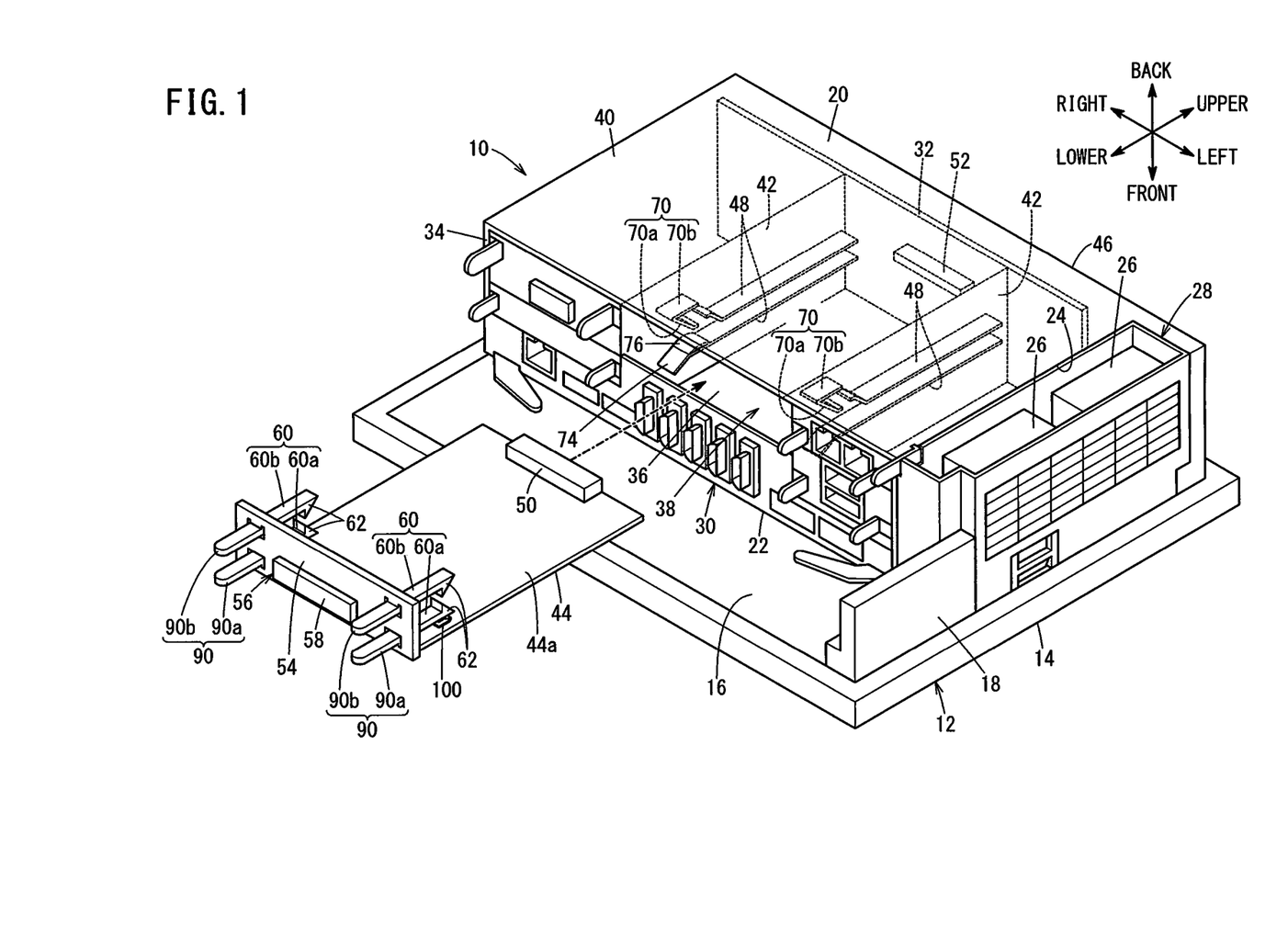
FIG. 1 is a perspective view showing the configuration of the entirety of an electronic device according to an embodiment.

As shown in FIG. 1, an electronic device 10 of this embodiment is applied to a control device for controlling an indicator 12 and non-illustrated industrial machine (e.g., a machine tool, robot, injection molding machine, wire electric discharge machine, etc.), for example. The indicator 12 is a liquid crystal display unit having a display screen (not shown) disposed on a front surface 14 thereof. The indicator 12 may be other type of display unit than liquid crystal. When the electronic device 10 is applied to a numerical control device for a machine tool, the indicator 12 is provided in an operation panel of the machine tool. In the description below, it should be noted that the directions will be indicated as up-down (upper-lower), right-left, and front-back seen from the front of the display screen of the indicator 12.

The electronic device 10 and a user interface unit 18, which is connectable to external equipment (not shown), are detachably mounted on a back surface 16 of the indicator 12 which is opposite to its front surface 14. In the example shown in FIG. 1, on the back surface 16 of the indicator 12, the electronic device 10 is detachably mounted on a top side of the back surface 16 of the indicator 12. Also on the back surface 16 of the indicator 12, the user interface unit 18 is detachably mounted in a corner on a lower side.

The electronic device 10 includes a box-shaped casing 20 that is detachably attached to the back surface 16 of the indicator 12. A bottom surface 22 of the casing 20 faces the back surface 16 of the indicator 12. Among the side surfaces of the casing 20 that adjoin the bottom surface 22, a fan unit 28 accommodating two fans 26 for cooling the interior of the casing 20 is detachably mounted to a side surface 24 of the casing 20 that is disposed closer to the user interface unit 18 and that extends in the up-down direction. The fan unit 28 may include at least a single fan 26.

The electronic device 10 includes the casing 20, a control unit 30 accommodated in the casing 20 and configured to control the indicator 12 and an industrial machine, and a back plate 32 accommodated in the casing 20 and connected to the control unit 30. Among the side surfaces of the casing 20 that adjoin the bottom surface 22 thereof, the under surface (a lower surface 34) adjoining the side surface 24, to which the fan unit 28 is attached, has a plurality of openings 36 with different shapes or sizes.

Inside the casing 20, a plurality of slots 38 are formed which extend from the respective openings 36 in the up-down direction parallel to the side surface 24 to which the fan unit 28 is attached. That is, inside the casing 20, a plurality of partition plates 42 extend to the bottom surface 22 of the casing 20 from a top plate 40 thereof opposite to the back surface 16 of the indicator 12. The interior of the casing 20 is thus partitioned into a plurality of spaces. Each of the plurality of divided spaces is formed as a slot 38, each slot 38 having an opening 36 formed on the side of the lower surface 34. In this embodiment, a plurality of partition plates that extend in the right-left direction may be further provided, and then the space in the casing 20 is divided in the front-back direction to form a plurality of slots 38.

The back plate 32 is a connection board connected to a plurality of circuit boards 44 constituting the control unit 30. The back plate 32 is disposed on the depth side of the direction to the upper side of the casing 20, i.e., on the depth side in the direction to the upper side of the plurality of slots 38. The back plate 32 extends in parallel with the side surface of the casing 20 on the upper side (an upper surface 46 thereof) and perpendicularly to its bottom surface 22. The back plate 32 is connected to the indicator 12 through a connector (not shown).

The control unit 30 includes the plurality of circuit boards 44 accommodated respectively in the plurality of slots 38 in an insertable and extractable manner. Surface mount devices (not shown) are mounted on mount surfaces 44a of the plurality of circuit boards 44. The plurality of slots 38 have different shapes or sizes from each other, and hence the plurality of circuit boards 44 have shapes or sizes corresponding to the shapes or sizes of the openings 36 so that the plurality of circuit boards 44 can be inserted into the corresponding ones of the slots 38. FIG. 1 shows the structure of the inside of the slots 38 by using broken line etc. in a case where one circuit board 44 is inserted or extracted from one slot 38. In FIG. 1, the direction in which the circuit board 44 is inserted corresponds to the upward direction, and the direction opposite to the insertion direction, i.e., a direction in which the circuit board 44 is extracted, corresponds to the downward direction.

Pairs of guide rails 48 are provided in each slot 38 in order to guide insertion of the circuit board 44 into the slot 38. The guide rails 48 of each pair are disposed on a partition plate 42 or on an inner wall constituting a side surface of the casing 20 in such a manner that the pairs of guide rails 48 correspond respectively to both ends of the circuit board 44 in the direction intersecting the insertion direction. The guide rails 48 of each pair extend along the up-down direction so as to be positioned respectively on both surface sides of the circuit board 44 inserted in the slot 38. Thus, when the circuit board 44 is being inserted into the slot 38, the pairs of guide rails 48 can guide the circuit board 44 to the back plate 32 in the insertion direction, with both ends of the circuit board 44 each fitted in the groove between the guide rails 48 of each pair. Further, the use of the pairs of guide rails 48 eliminates the need to position the circuit board 44 in the front-back direction and right-left direction when the circuit board 44 is inserted into the slot 38.

A first connector 50 is provided at an end of the circuit board 44 that is closer to the back plate 32 (at the end in the direction in which the circuit board 44 is inserted). Further, on the back plate 32, a plurality of second connectors 52 are provided which respectively fit to the first connectors 50 when the circuit boards 44 are inserted respectively in the plurality of slots 38. In this way, when inserted (accommodated) in the slots 38, the circuit boards 44 can control the indicator 12 through the first connectors 50 and the second connectors 52 in the fitted state and the back plate 32.

Figure 2:
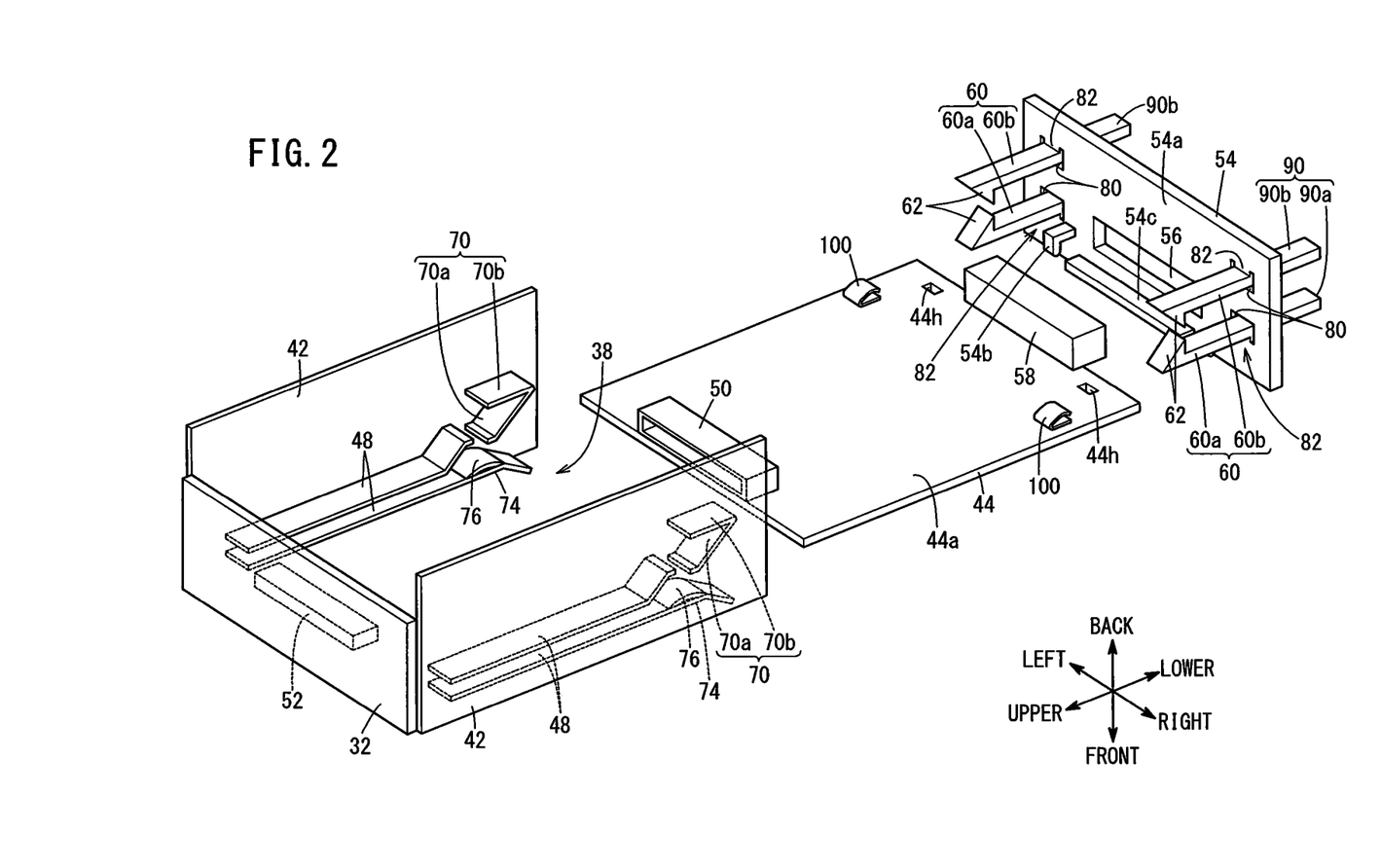
FIG. 2 is an exploded perspective view showing the configuration of part of the electronic device of FIG. 1.
Figure 3:
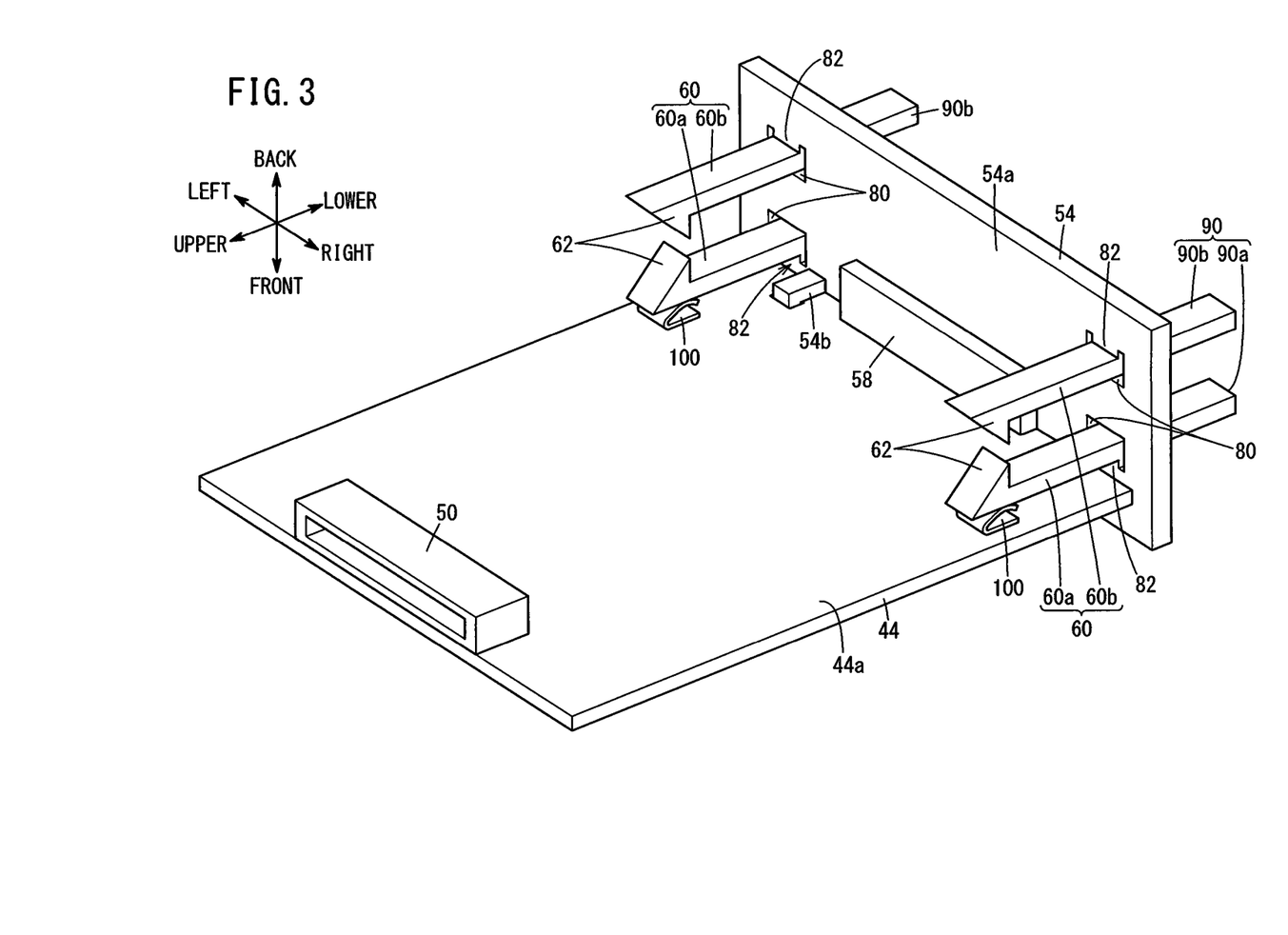
FIG. 3 is a perspective view showing a circuit board and a faceplate connected together.

Further, a faceplate 54 supporting the circuit board 44 is provided at the end of the circuit board 44 in the extraction direction (in the downward direction) which is opposite to the insertion direction. That is, as shown in FIGS. 2 and 3, two fitting holes 44h are formed respectively near both ends of the circuit board 44, and two fitting claws 54b are formed on a surface (upper surface) 54a of the faceplate 54 on the insertion side, in correspondence with the two fitting holes 44h. Also, a supporting portion 54c protruding in the insertion direction is formed between the two fitting claws 54b on the upper surface 54a. The faceplate 54 supports the circuit board 44, with the end of the circuit board 44 on the extraction side being in contact with the upper surface 54a of the faceplate 54, the circuit board 44 being supported by the supporting portion 54c, and with the two fitting claws 54b fitted in the two fitting holes 44h. When the circuit board 44 is inserted in the slot 38, the faceplate 54 abuts on the lower surface 34 of the casing 20 and closes the opening 36.

Furthermore, a third connector 58 is provided at the end of the circuit board 44 on the extraction side (on the lower side). The third connector 58 is exposed to the exterior through an opening 56 formed in the faceplate 54. The third connector 58 can be connected to an external connector. This makes it possible to supply signals from the outside to the circuit board 44 through the third connector 58, or to output signals from the circuit board 44 to the outside through the third connector 58.

In this way, by making the circuit board 44 as a unit, the circuit board 44 can be easily packaged and carried about, and measures against static electricity can be easily taken for the circuit board 44.

[Characteristic Features of this Embodiment]

Next, characteristic features of the electronic device 10 according to this embodiment will be described referring to FIGS. 1 to 3. The electronic device 10 of this embodiment further comprises the following constituent elements in order to stably fix the circuit board 44 inserted in the slot 38 of the casing 20 and ensure vibration resistance.

On the surface (upper surface) 54a of the faceplate 54 on the insertion side, pairs of locking portions 60 are provided respectively on the sides of both ends of the circuit board 44. The pairs of locking portions 60 are provided to fix the faceplate 54 to the casing 20 when the circuit board 44 is inserted in the slot 38. The locking portions 60 of each pair are spaced at an interval on the mount surface 44a side of the circuit board 44. The locking portion 60 of each pair that is disposed closer to the mount surface 44a of the circuit board 44 (the one disposed on the front side) is referred to as a front-side locking portion 60a, and the locking portion 60 of each pair that is disposed farther from the mount surface 44a of the circuit board 44 (the one disposed on the back side) is referred to as a back-side locking portion 60b.

The front-side locking portion 60a and the back-side locking portion 60b are elastically deformable, and extend substantially in parallel to each other along the insertion direction. The front-side locking portion 60a has formed thereon a locking claw 62 projecting toward the back-side locking portion 60b, and the back-side locking portion 60b has formed thereon a locking claw 62 projecting toward the front-side locking portion 60a.

When the circuit board 44 is inserted in the slot 38, the pairs of locking portions 60 (the front-side locking portions 60a and the back-side locking portions 60b) engage respectively with pairs of engaging portions 70 provided on the casing 20 in the slot 38 so as to fix the faceplate 54 to the casing 20. As to the engaging portions 70 of each pair, the engaging portion 70 with which the front-side locking portion 60a engages is referred to as a front-side engaging portion 70a, and the engaging portion 70 with which the back-side locking portion 60b engages is referred to as a back-side engaging portion 70b.

The engaging portions 70 of each pair (the front-side engaging portion 70a and the back-side engaging portion 70b) are formed on a partition plate 42 or on an inner wall forming a side surface of the casing 20 such that the pairs of engaging portions 70 correspond respectively to both ends of the circuit board 44 in the direction intersecting the insertion direction.

Each back-side engaging portion 70b extends along the insertion direction, and each front-side engaging portion 70a extends obliquely with respect to the back-side engaging portion 70b so as to separate away from the back-side engaging portion 70b toward the insertion side. The ends of the front-side engaging portion 70a and back-side engaging portion 70b on the extraction side are joined together, and their ends on the insertion side are formed as open ends.

When the circuit board 44 is inserted in the slot 38, the locking claw 62 of the front-side locking portion 60a engages with the open end of the front-side engaging portion 70a. Also, when the circuit board 44 is inserted in the slot 38, the locking claw 62 of the back-side locking portion 60b engages with the open end of the back-side engaging portion 70b. That is, when the circuit board 44 is inserted in the slot 38, the locking portions 60 of each pair (the front-side locking portion 60a and back-side locking portion 60b) engage respectively with the engaging portions 70 (the front-side engaging portion 70a and back-side engaging portion 70b) such that the locking portions 60 catch the engaging portions 70 therebetween. In this way, the pairs of locking portions 60 can fix the faceplate 54 to the casing 20 when the circuit board 44 is inserted in the slot 38.

In this embodiment, rail extension portions 74 are provided respectively on the front sides of the engaging portions 70 (front-side engaging portions 70a). Each rail extension portion 74 extends one of the guide rails 48 of the pair such that the one guide rail 48 becomes longer than the other guide rail 48 in the extraction direction. The rail extension portion 74 is joined to that one of the pair of guide rails 48. It should be noted that, in this embodiment, "one" of the guide rails 48 of a pair designates the one that faces the surface of the circuit board 44 that is opposite to the mount surface 44a when the circuit board 44 is inserted in the slot 38.

Each rail extension portion 74 is provided on a partition plate 42 or on an inner wall forming a side surface of the casing 20 such that the rail extension portions 74 correspond respectively to both ends of the circuit board 44 in the direction that intersects the insertion direction. The front-side engaging portion 70a is disposed at an interval from the rail extension portion 74, and the circuit board 44 and the front-side locking portion 60a pass between the rail extension portion 74 and the front-side engaging portion 70a.

Further, each rail extension portion 74 has formed thereon a protruding portion 76 that protrudes toward the front-side engaging portion 70a. Provision of the protruding portion 76 on the rail extension portion 74 prevents the circuit board 44 from coming into surface contact with the guide rail 48 when the circuit board is inserted into the slot 38, which allows the circuit board 44 to be easily inserted into the slot 38.

Openings 80 are formed in the upper surface 54a of the faceplate 54, each opening 80 being located at the proximal end of each of the front-side locking portion 60a and back-side locking portion 60b which are provided on sides of both ends of the circuit board 44. The four openings 80 are respectively provided with supporting portions 82.

Each supporting portion 82 supports the locking portion 60 and a handling portion 90. The supporting portion 82 joins the front-side locking portion 60a and a handling portion 90, or the back-side locking portion 60b and a handling portion 90. The handling portions 90 joined respectively to the front-side locking portions 60a are referred to as front-side handling portions 90a, and the handling portions 90 joined respectively to the back-side locking portions 60b are referred to as back-side handling portions 90b.

The handling portions 90 (front-side handling portion 90a and back-side handling portion 90b) are operated to release engagement between the locking portions 60 and engaging portions 70. That is, when the front-side handling portion 90a and the back-side handling portion 90b are operated such that they get closer to each other, the supporting portions 82 bend, so that the front-side locking portion 60a and back-side locking portion 60b, joined respectively to the front-side handling portion 90a and back-side handling portion 90b, move away from each other. This releases the engagement of the pair of locking portions 60 (the front-side locking portion 60a and back-side locking portion 60b) holding the engaging portions 70 (the front-side engaging portion 70a and back-side engaging portion 70b) therebetween.

Elastic members 100 are provided respectively between the front-side locking portions 60a provided on the upper surface 54a of the faceplate 54 correspondingly to both ends of the circuit board 44, and the circuit board 44 supported by the faceplate 54.

Each elastic member 100 is capable of expanding and contracting in the direction of the thickness of the circuit board 44 (in the front-back direction), and is placed in a compressed state between the circuit board 44 and the locking portion 60 (the front-side locking portion 60a). The side of the elastic member 100 that faces the circuit board 44 is mounted on the mount surface 44a of the circuit board 44 and thus fixed to the circuit board 44. On the other hand, the side of the elastic member 100 that faces the front-side locking portion 60a is in contact with the front-side locking portion 60a. The front-side locking portion 60a side of the elastic member 100 may be fixed to the front-side locking portion 60a, but need not necessarily be fixed to the front-side locking portion 60a.

When the circuit board 44 is inserted in the slot 38, the elastic member 100 presses the circuit board 44 against the one (the one on the front side) of the guide rails 48 of a pair. That is, when the circuit board 44 is inserted in the slot 38, the locking portion 60 (the front-side locking portion 60a) engages with the engaging portion 70 (the front-side engaging portion 70a) and fixed. Accordingly, the elastic member 100, placed in a compressed state between the locking portion 60 (front-side locking portion 60a) and the circuit board 44, presses the circuit board 44 against the one of the guide rails 48 of the pair (the one on the front side) when the circuit board 44 is inserted in the slot 38.

In this way, the elastic members 100 press the circuit board 44 against the ones of the guide rails 48 of the pairs (i.e., against the guide rails positioned on the front side) when the circuit board 44 is inserted in the slot 38, and the circuit board 44 inserted in the slot 38 can be fixed to the ones of the guide rails 48 of the pairs (the ones on the front side).

Specifically, for example, the elastic members 100 can be springs for surface mounting (SMD springs), clips for surface mounting (SMD clips), or flat springs.

[Insertion and Extraction of Circuit Board 44 into and from Slot 38]

Next, the procedure of inserting and extracting the circuit board 44 into and from the slot 38 will be described. First, the case where the circuit board 44 is inserted into the slot 38 will be described referring to FIGS. 4 to 6.

Figure 4:
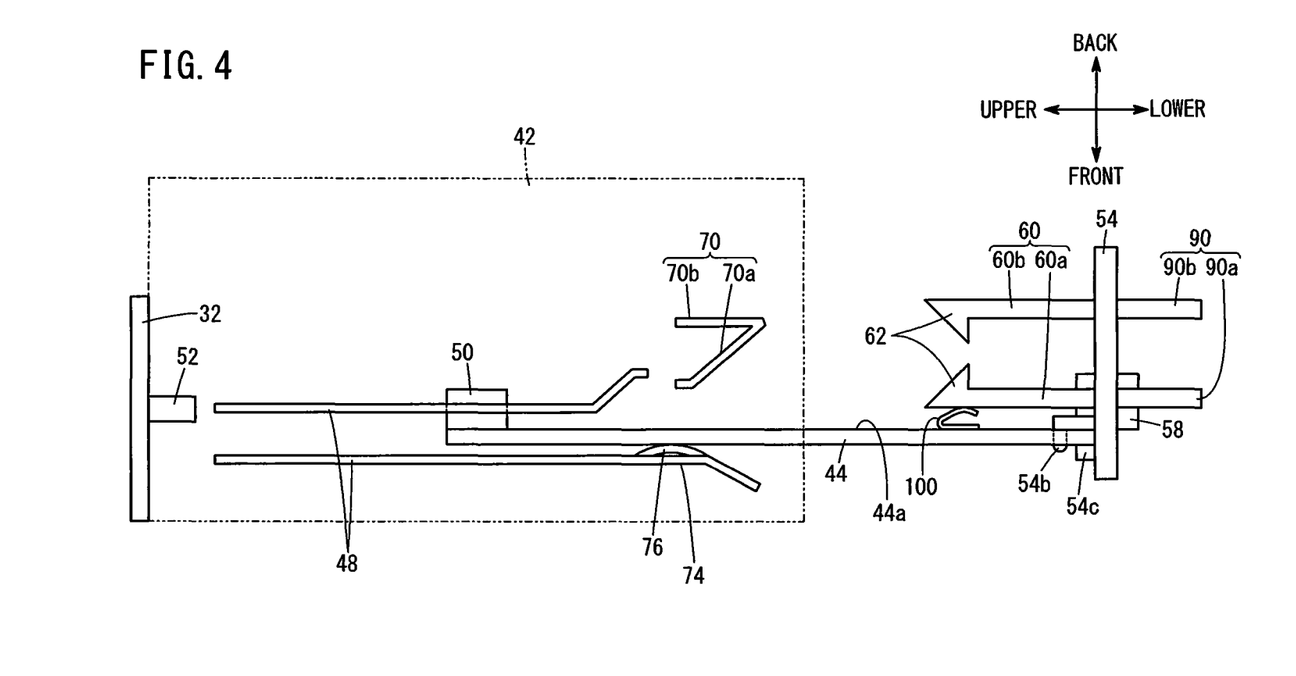
FIG. 4 is a schematic diagram showing a state in which the operation of inserting the circuit board into a slot has just begun.

With the circuit board 44 supported on the faceplate 54, the circuit board 44 is inserted into the slot 38 with the first connector 50 directed to the insertion side (see FIG. 4). Both ends of the circuit board 44, on the insertion side, are thus inserted between the guide rails 48 of the pairs. As a result, the circuit board 44 can be moved toward the back plate 32, while both their ends are guided by the pairs of guide rails 48. That is, the circuit board 44 is inserted into the slot 38 in a state in which the circuit board 44 is positioned by the pairs of guide rails 48 in the right-left direction and front-back direction.

Figure 5:
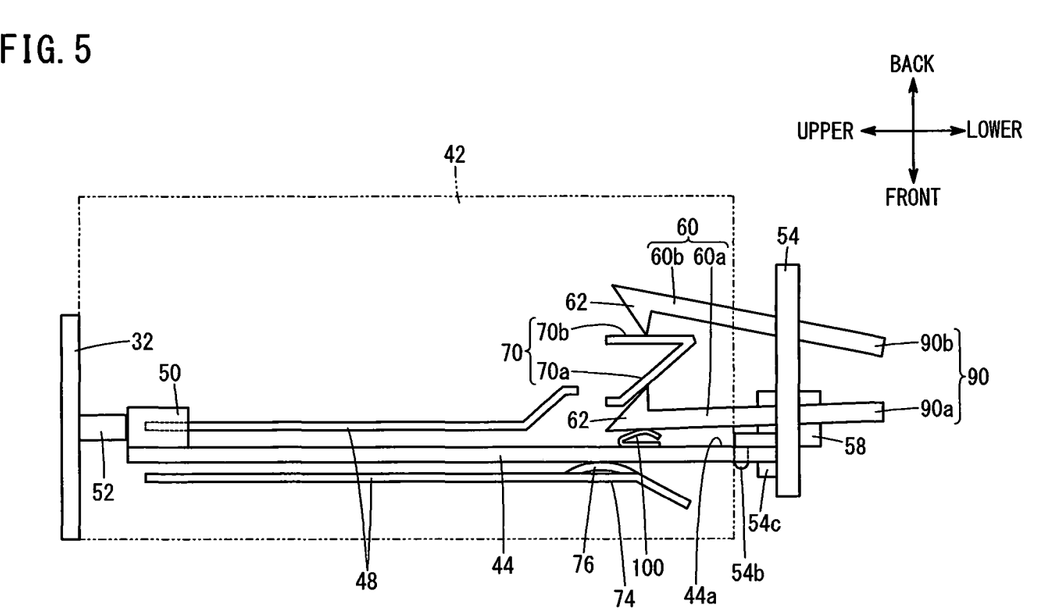
FIG. 5 is a schematic diagram showing the circuit board being inserted into the slot.

As the circuit board 44 is inserted further forward, the locking portions 60 abut on the engaging portions 70, and the front-side locking portion 60a and the back-side locking portion 60b of the locking portions 60 elastically deform to open (i.e., separate from each other) along the front-side engaging portion 70a and the back-side engaging portion 70b of the engaging portions 70 (see FIG. 5).

Figure 6:
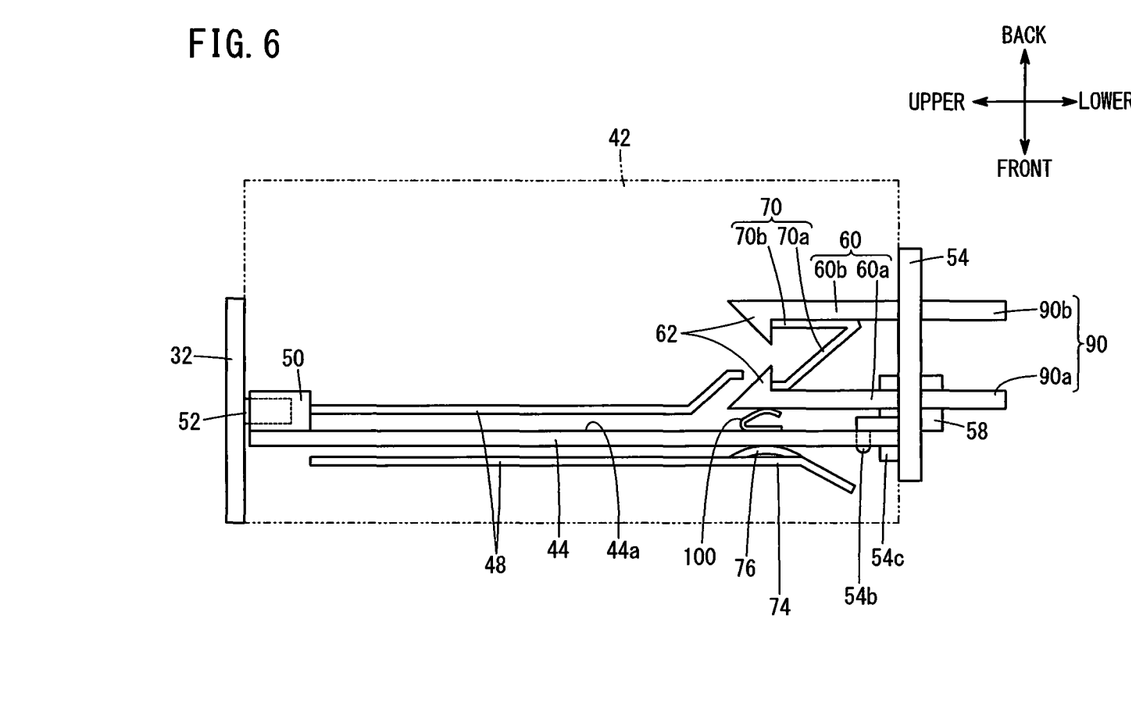
FIG. 6 is a schematic diagram showing the circuit board having been inserted in the slot.

After that, when the circuit board 44 is further inserted, the locking claw 62 of the front-side locking portion 60a engages with the open end of the front-side engaging portion 70a, and the locking claw 62 of the back-side locking portion 60b engages with the open end of the back-side engaging portion 70b, whereby the locking portions 60 hold and sandwich the engaging portions 70 therebetween (see FIG. 6). The faceplate 54 is thus fixed.

When the locking portions 60 engage with the engaging portions 70, the end of the circuit board 44 on the insertion side is now located near the back plate 32, and the circuit board 44 has thus been inserted in the slot 38. In this state, the first connector 50 and the second connector 52 fit together and the faceplate 54 abuts on the lower surface 34 of the casing 20 and closes the opening 36.

In this state, the elastic member 100 compressed between the circuit board 44 and the locking portion 60 presses the circuit board 44 against the one (the one on the front side) of the guide rails 48 of the pair, and the pressing force of the elastic member 100 holds down the circuit board 44 onto that one (the one on the front side) of the guide rails 48 of the pair.

In this way, it is possible to prevent loads from being exerted to the fitted portion (contact portion) between the first connector 50 and the second connector 52 and to the soldered portion between the first connector 50 and the circuit board 44.

Next, the case where the circuit board 44 is extracted from the slot 38 will be described. First, an operator operates the two handling portions 90 exposed outward from the faceplate 54 such that the front-side handling portion 90a and the back-side handling portion 90b get closer to each other. This causes the supporting portions 82 to bend, whereby the front-side locking portions 60a and the back-side locking portions 60b, joined respectively to the front-side handling portions 90a and the back-side handling portions 90b, are caused to move away from each other. This releases the engagement between the locking portions 60 (the front-side locking portions 60a and back-side locking portions 60b) and the engaging portions 70 (the front-side engaging portions 70a and back-side engaging portions 70b).

Next, while holding the two handling portions 90 such that the front-side handling portions 90a and back-side handling portions 90b are close to each other, the operator pulls the faceplate 54 in the extraction direction. This releases the fitting between the first connector 50 and the second connector 52. When the operator further pulls the faceplate 54, the circuit board 44 can be pulled out of the slot 38, with both ends of the circuit board 44 being guided by the pairs of guide rails 48.

[Modifications]

While the embodiment has been described above as an example of the present invention, the technical scope of the present invention is not limited to the scope described in the embodiment. Various modifications or improvements can of course be applied to the embodiment above. It is clear from the recitation of claims that such variously modified or improved embodiments can be included in the technical scope of the present invention.

(Modification 1)

Figure 7:
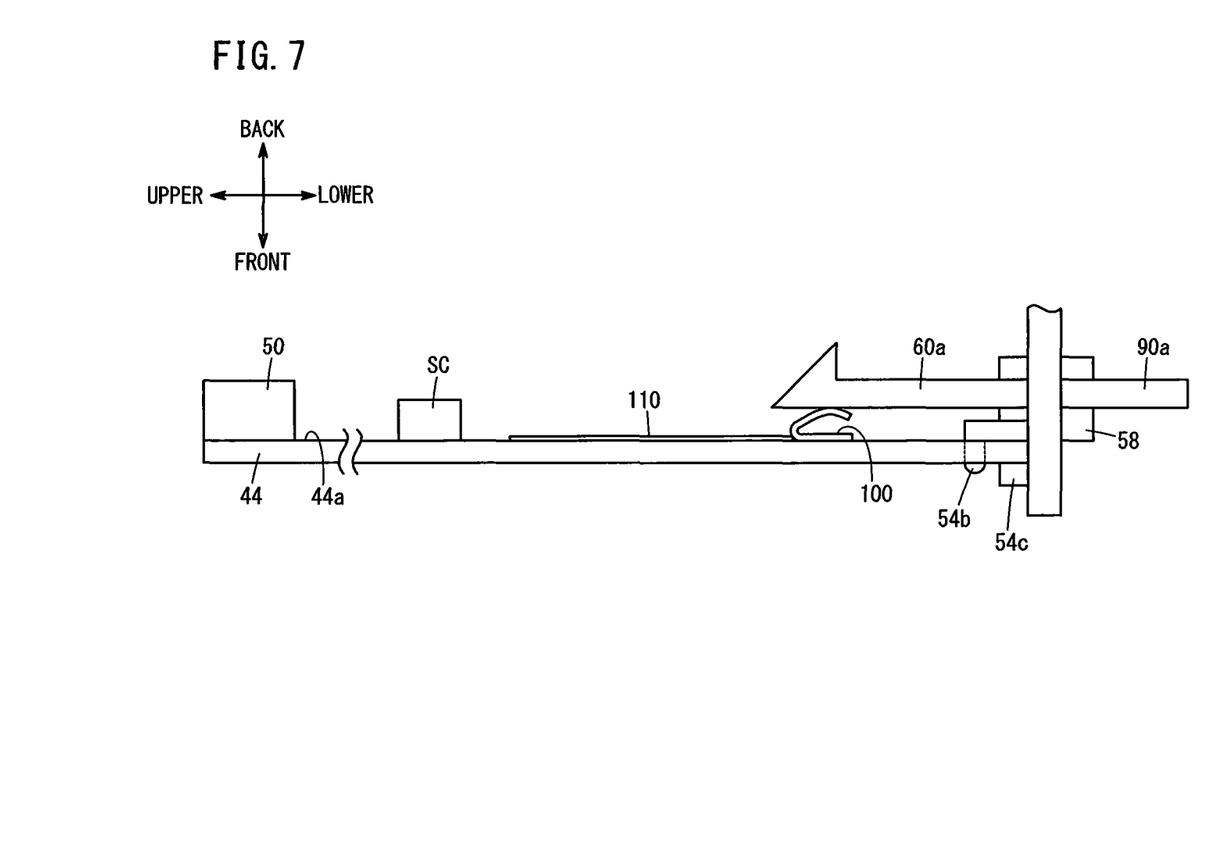
FIG. 7 is a sectional view showing the configuration of part of an electronic device according to modification 1.

FIG. 7 is a cross section showing the configuration of part of an electronic device according to modification 1. Constituent elements similar to those described in the embodiment above will be labeled using the same reference numerals and overlapping descriptions will not be repeated.

In the electronic device of modification 1, a metal member 110 for absorbing electromagnetic noise in the slot 38 is provided on the circuit board 44. In the example of FIG. 7, the metal member 110 is placed on the mount surface 44a of the circuit board 44, but it may be provided at least on a part of the circuit board 44 other than the mounting area where a surface mount component SC is mounted. Specifically, the metal member 110 may be a printed wiring pattern, for example.

The metal member 110 is in contact with at least one of the elastic members 100 provided on the mount surface 44a of the circuit board 44, and is electrically and mechanically connected to that elastic member 100. In the electronic device of modification 1, this elastic member 100, the locking portion 60 (the front-side locking portion 60a) on which the elastic member 100 abuts, and the handling portion 90 (the front-side handling portion 90*a*) joined to that locking portion 60 (the front-side locking portion 60*a*) are made of metal.

Accordingly, when electromagnetic noise is absorbed by the metal member 110, the electromagnetic noise is transmitted from the metal member 110 to the elastic member 100, and is radiated to the outside through the elastic member 100, locking portion 60, and handling portion 90.

In this way, according to the electronic device of modification 1, electromagnetic noise in the slot 38 is absorbed by the metal member 110, and the electromagnetic noise absorbed by the metal member 110 can be readily radiated outward through the elastic member 100, locking portion 60, and handling portion 90.

(Modification 2)

Figure 8:
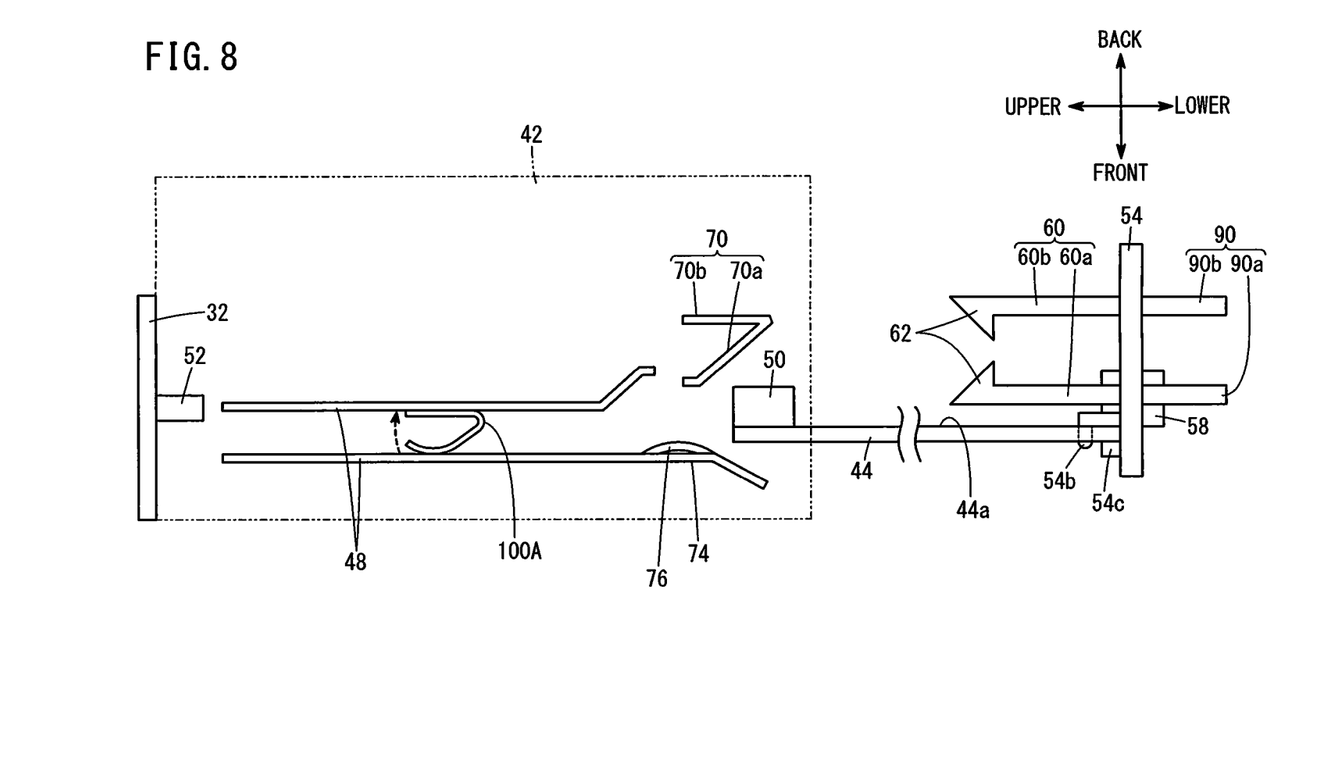
FIG. 8 is a schematic diagram showing example (1) in which elastic members are disposed at different positions from those of the embodiment.

In the above-described embodiment, the elastic member 100 is placed between the circuit board 44 and the locking portion 60 (front-side locking portion 60*a*). However, the elastic member 100 may be placed at a position other than between the circuit board 44 and the locking portion 60. For example, as shown in FIG. 8, an elastic member 100A may be placed between the guide rails 48 of a pair.

The elastic member 100A can expand and contract in the thickness direction (the front-back direction) of the circuit board 44 guided by the pair of guide rails 48. The elastic member 100A has its one end portion in the expand/contract direction fixed to the other one (the one on the back side) of the guide rails 48 of the pair, and has its other end portion in the expand/contract direction being a free end. Further, the elastic member 100A has a portion inclined from its fixed end to its free end such that the height of the elastic member from the other guide rail 48 (which is located on the back side) becomes larger toward the insertion side.

When the circuit board 44 is inserted in the slot 38, the elastic member 100A is compressed by being pressed by the circuit board 44 toward that other one (the one on the back side) of the guide rails 48, whereby the elastic member 100A presses the circuit board 44 against one (the one on the front side) of the guide rails 48.

In this way, similarly to the configuration of the above-described embodiment, providing the elastic member 100A between the guide rails 48 of a pair also prevents loads from being exerted to the fitted portion (contact portion) between the first connector 50 and second connector 52 and to the soldered portion between the first connector 50 and circuit board 44.

Figure 9:
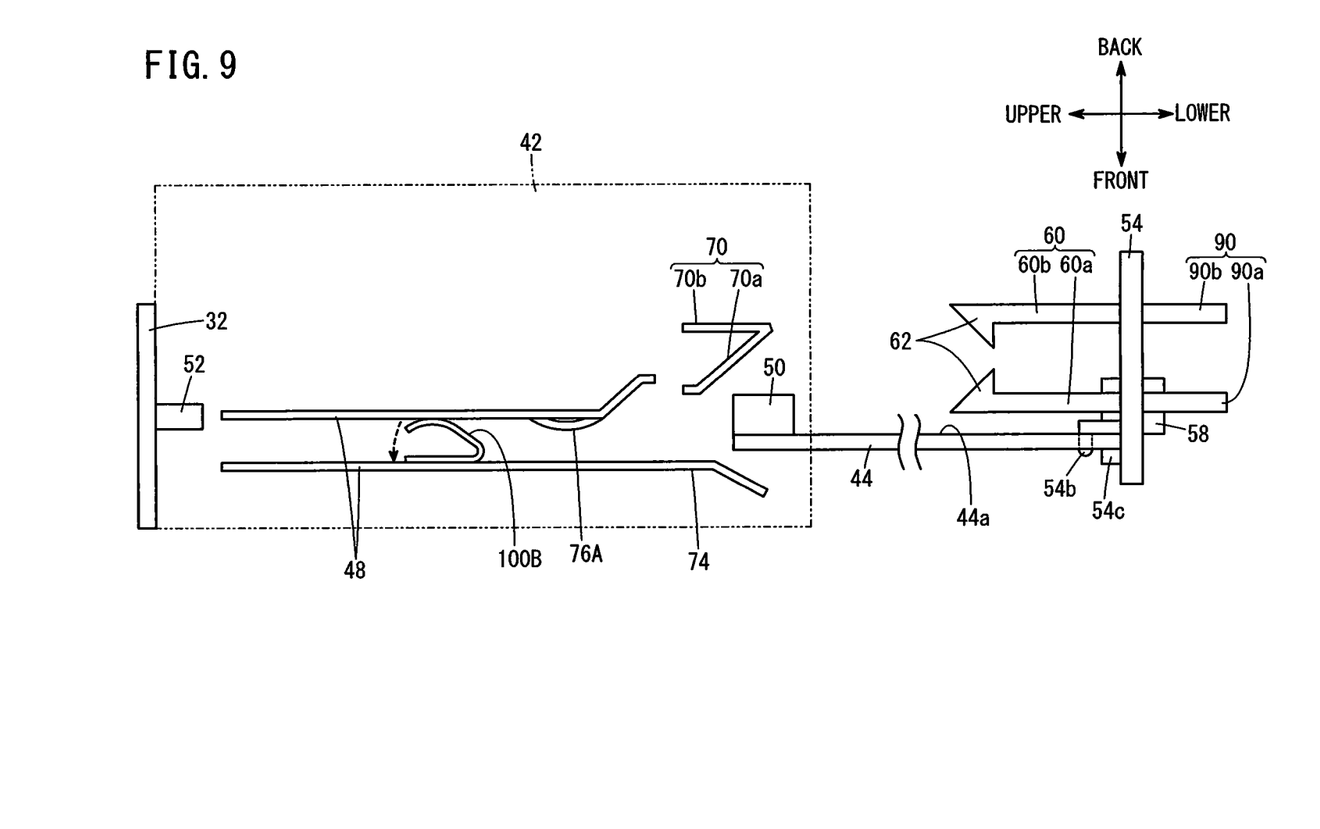
FIG. 9 is a schematic diagram showing example (2) in which elastic members are disposed at different positions from those of the embodiment.

Further, an elastic member 100B may be provided between the guide rails 48 of a pair as shown in FIG. 9. In the example of FIG. 9, a protruding portion 76A is provided on the other one (the one on the back side) of the guide rails 48 in place of the protruding portion 76 provided on the rail extension portion 74.

The elastic member 100B can expand and contract in the thickness direction (the front-back direction) of the circuit board 44 guided by the pair of guide rails 48. The elastic member 100B has its one end portion in the expand/contract direction fixed to one (the one on the front side) of the guide rails 48 of the pair, and has its other end portion in the expand/contract direction being a free end. Further, the elastic member 100B has an inclined portion inclined from its fixed end to its free end such that the height of the elastic member from the one guide rail 48 (which is located on the front side) becomes larger toward the insertion side.

When the circuit board 44 is not inserted in the slot 38, the elastic member 100B has its equilibrium length between the guide rails 48 of the pair. On the other hand, when the circuit board 44 is inserted in the slot 38, the elastic member 100B is pressed and compressed by the circuit board 44 toward the one (the one on the front side) of the guide rails 48, and the elastic member 100B presses the circuit board 44 against the other one (the one on the back side) of the guide rails 48 of the pair.

In this way, similarly to the configuration of the above-described embodiment, providing the elastic member 100B between the guide rails 48 of a pair also prevents loads from being exerted to the fitted portion (contact portion) between the first connector 50 and second connector 52 and to the soldered portion between the first connector 50 and circuit board 44.

During insertion of the circuit board 44 into the slot 38, the circuit board 44 and the elastic members 100A or 100B come into contact with each other in some part. This part will be rubbed, though such rubbing might be alleviated by the elasticity of the elastic members 100A or 100B. Accordingly, from the point of view of avoiding the rubbing between the circuit board 44 and the elastic members 100A or 100B during insertion of the circuit board 44 into the slot 38, it is preferable to place the elastic members 100 between the circuit board 44 and the locking portions 60 (front-side locking portions 60*a*) as described in the embodiment above.

(Modification 3)

The locking portions 60 of the embodiment above include the front-side locking portion 60*a* and the back-side locking portion 60*b*. However, the back-side locking portion 60*b* may be omitted. When the back-side locking portion 60*b* is omitted, the back-side handling portion 90*b* of the handling portions 90 may also be omitted. Also, in this case, the back-side engaging portion 70*b* of the engaging portions 70 may be absent. Omitting the back-side locking portion 60*b* reduces the number of parts and saves space. When the back-side locking portions 60*b* are omitted, the front-side locking portions 60*a* and the front-side handling portions 90*a* are respectively joined together in the up-down direction through a pair of the supporting portions 82.

(Modification 4)

The embodiment and modifications 1 to 3 described above may be arbitrarily combined in a range where no contradiction is incurred.

[Technical Ideas Obtained from Embodiments]

Technical ideas that can be grasped from the embodiments and modifications described above will be recited below.

The electronic device (10) includes a casing (20), a circuit board (44), a first connector (50), a second connector (52), pairs of guide rails (48), and elastic members (100, 100A, 100B).

The casing (20) has a slot (38) and the circuit board (44) is inserted in the slot (38). The first connector (50) is provided at an end of the circuit board (44) in an insertion direction. The second connector (52) is provided in the casing (20) and fitted with the first connector (50) when the circuit board (44) is inserted in the slot (38).

The pairs of guide rails (48) are provided correspondingly to respective both ends of the circuit board (44) in a direction intersecting the insertion direction, so as to guide insertion of the circuit board (44) into the slot (38). Further, the guide rails (48) of each pair are provided in the slot (38) so as to extend along the insertion direction respectively on the sides of both surfaces of the circuit board (44) inserted in the slot (38).

When the circuit board (44) is inserted in the slot (38), each elastic member (100, 100A, 100B) presses the circuit board (44) against one or the other of the guide rails (48) of each pair.

Thus, when the circuit board (44) is inserted in the slot (38), the circuit board (44) is held against one of the guide rails (48) of each pair by the pressing force of the elastic members (100, 100A, 100B). As a result, it is possible to stably fix the circuit board (44) inserted in the slot (38) of the casing (20) so as to ensure vibration resistance.

The electronic device (10) may further include: a faceplate (54) provided at an end of the circuit board (44) in an extraction direction opposite to the insertion direction, and configured to support the circuit board (44); locking portions (60) provided on the faceplate (54) and extending in the insertion direction from the faceplate (54) respectively on sides of the both ends of the circuit board (44), the locking portions being configured to fix the faceplate (54) to the casing (20) when the circuit board (44) is inserted in the slot (38); and engaging portions (70) that are provided on the casing (20) in the slot (38), wherein the locking portions (60) engage respectively with the engaging portions when the circuit board (44) is inserted in the slot (38). The elastic members (100) may be placed respectively between the circuit board (44) and the locking portions (60).

Then, as compared to cases where elastic members (100A, 100B) are placed respectively between the guide rails (48) of the pairs, rubbing between the circuit board (44) and the elastic members (100) is reduced when the circuit board (44) is inserted into the slot (38).

The electronic device (10) may further include rail extension portions (74) each joined to one of the guide rails (48) of each pair and extending in the extraction direction further than the other of the guide rails (48) of the pair, and the elastic members (100) may be placed in a compressed state respectively between the rail extension portions (74) and the engaging portions (70).

It is then possible to hold and press the circuit board (44) when the circuit board (44) is inserted in the slot (38) without hindering the guiding of the circuit board (44) by the guide rails (48).

The electronic device (10) may further include: a metal member (110) provided at least on a part of the circuit board (44) other than a mount area on which a surface mount component is mounted and being in contact with at least one of the elastic members (100); and handling portions (90) joined respectively to the locking portions (60) and extending so as to project from the faceplate (54) to an outside of the casing (20), the handling portions being configured to release engagement between the locking portions (60) and the engaging portions (70). The elastic member (100) that is in contact with the metal member (110), and the locking portion (60) and the handling portion (90) that are disposed on the same side as the elastic member (100), may be made of metal.

It is then possible to absorb electromagnetic noise in the casing (20) at the metal member (110) and readily radiate or dissipate the electromagnetic noise from the metal member (110) to the outside through the elastic member (100), the locking portion (60), and the handling portion (90).

What is claimed is:

1. An electronic device comprising:
a casing having a slot;
a circuit board configured to be inserted in the slot;
a first connector provided at an end of the circuit board in an insertion direction;
a second connector provided in the casing and configured to be fitted with the first connector when the circuit board is inserted in the slot;
pairs of guide rails provided in the slot correspondingly to respective both ends of the circuit board in a direction intersecting the insertion direction, the guide rails of each of the pairs extending along the insertion direction respectively on sides of both surfaces of the circuit board inserted in the slot, the pairs of guide rails being configured to guide insertion of the circuit board into the slot;
elastic members configured to, when the circuit board is inserted in the slot, press the circuit board against one or another of the guide rails of each of the pairs;
a faceplate provided at an end of the circuit board in an extraction direction opposite to the insertion direction, and configured to support the circuit board;
locking portions provided on the faceplate and extending in the insertion direction from the faceplate respectively on sides of the both ends of the circuit board, the locking portions being configured to fix the faceplate to the casing when the circuit board is inserted in the slot; and
engaging portions that are provided on the casing in the slot, wherein the locking portions engage respectively with the engaging portions when the circuit board is inserted in the slot, wherein the elastic members are placed respectively between the circuit board and the locking portions.

2. The electronic device according to claim 1, further comprising rail extension portions each joined to one of the guide rails of each pair and extending in the extraction direction further than another of the guide rails of the pair, and
the elastic members are placed in a compressed state respectively between the rail extension portions and the engaging portions.

3. The electronic device according to claim 1, further comprising:
a metal member provided at least on a part of the circuit board other than a mount area on which a surface mount component is mounted and being in contact with at least one of the elastic members, and
handling portions joined respectively to the locking portions and extending so as to project from the faceplate to an outside of the casing, the handling portions being configured to release engagement between the locking portions and the engaging portions,
wherein the elastic member that is in contact with the metal member, and the locking portion and the handling portion that are disposed on a same side as the elastic member, are made of metal.

* * * * *